(12) United States Patent
Martinson

(10) Patent No.: US 6,693,578 B1
(45) Date of Patent: Feb. 17, 2004

(54) MIXER OPTIMIZATION FOR ACTIVE RADAR WARNING RECEIVER

(75) Inventor: Glen D. Martinson, Oakville (CA)

(73) Assignee: Beltronics USA, Inc., West Chester, OH (US)

( * ) Notice: Subject to any disclaimer, the term of this patent is extended or adjusted under 35 U.S.C. 154(b) by 0 days.

(21) Appl. No.: 10/392,002

(22) Filed: Mar. 18, 2003

(51) Int. Cl.[7] .................................................. G01S 7/40
(52) U.S. Cl. .......................... 342/20; 342/89; 342/100
(58) Field of Search .............................. 342/20, 89, 91, 342/92, 93, 98, 99, 100, 159, 162, 175, 195

(56) References Cited

U.S. PATENT DOCUMENTS

| | | | |
|---|---|---|---|
| 4,181,910 A | * 1/1980 | Hitterdal ...................... 342/20 |
| 4,182,990 A | * 1/1980 | Coffin et al. ................. 340/600 |
| 4,622,553 A | * 11/1986 | Baba et al. .................... 342/91 |
| 4,860,013 A | * 8/1989 | Huntley ......................... 342/20 |
| 4,952,936 A | * 8/1990 | Martinson ..................... 342/20 |
| 4,961,074 A | 10/1990 | Martinson ..................... 342/20 |
| 5,361,069 A | * 11/1994 | Klimek, Jr. et al. ......... 342/20 |
| 5,446,923 A | 8/1995 | Martinson et al. .......... 455/330 |
| 5,530,927 A | * 6/1996 | Smith .......................... 455/317 |
| 5,917,441 A | * 6/1999 | Valentine et al. ............. 342/20 |
| 5,990,821 A | * 11/1999 | Sakar ............................ 342/54 |
| 6,069,580 A | 5/2000 | Martinson ..................... 342/20 |
| 6,175,324 B1 | * 1/2001 | Valentine et al. ............. 342/20 |
| 6,587,068 B2 | * 7/2003 | Kuhn et al. ................... 342/20 |
| 6,617,995 B2 | * 9/2003 | Kim et al. .................... 342/20 |

OTHER PUBLICATIONS

Motorola, Inc. Product Literature for "Low Power Integrated Receiver for ISM Band Applications", Motorola Literature Division, No. MC13145D, Denver, Colorado, (1999), 19 pages.

* cited by examiner

Primary Examiner—John B. Sotomayor
(74) Attorney, Agent, or Firm—Wood, Herron & Evans LLP

(57) ABSTRACT

A method to optimize a mixer (20) includes setting a DC bias current (24) at a predetermined level correlated to an RF frequency or band of interest, and varying the power output (32) of a local oscillator (36) until the DC voltage (66) of the mixer (20) is at a predetermined voltage. The setting for the local oscillator (36) is then stored, such as in volatile RAM (60), for use during normal operation of the receiver (10) to produce IF signals (40) correlated to the RF frequencies or band or interest. The process may be implemented on power-up of the receiver and/or periodically during use thereof in the field to reoptimize the mixer (20), and may be undertaken with different predetermined currents and voltages for different RF frequencies and/or bands.

40 Claims, 2 Drawing Sheets

MIXER OPTIMIZATION FOR ACTIVE RADAR WARNING RECEIVER

BACKGROUND OF THE INVENTION

I. Field of the Invention

The present invention relates to RF signal receivers, and more particularly, to mixer optimization for RF signal receivers with swept local oscillators such as radar warning receivers.

II. Description of Prior Art

RF receivers typically include an antenna through which RF signals are received and coupled to a mixer. The mixer also receives a local oscillator signal and mixes the received RF signals with the fundamental frequency of the local oscillator signal and/or other harmonics thereof to produce an IF signal (heterodyne) which can then be processed directly. The IF signal may first be further down-converted with a second mixer and oscillator to a second IF signal (superheterodyne) before processing. In the area of radar warning receivers, the fundamental frequency of the local oscillator signal is selected so that the harmonics correlate to the police radar bands of X, K and/or Ka such that further processing will allow for determination of whether the RF signals received are police radar signals and to alert a driver thereto.

It is useful to receive RF signals from as far away from the transmitter as possible. This can be important particularly for a radar warning receiver which has to detect the presence of police radar signals from as far a distance from the radar transmitter as possible in order to alert the user to the presence of such radar at the earliest possible opportunity. As that distance from the transmitter increases, the ability to detect and utilize the RF signals becomes dependent on many factors, including the sensitivity of the RF receiver. One factor affecting such sensitivity is conversion loss in the mixer, it being advantageous to minimize such conversion loss. During manufacture of the receiver, the power of the local oscillator providing the local oscillator signal as well as the DC bias on the mixer can be iteratively adjusted until optimized mixing occurs. Those settings are then stored in a non-volatile memory and accessed by a microcontroller or other microprocessor-based device which may be used to set the power driving the local oscillator and/or the DC bias on the mixer through digital-to-analog converters (DAC) during subsequent use of the receiver. In this context, when a radar warning receiver is manufactured, a test signal is transmitted to the receiver and the LO power and DC bias are iteratively adjusted until the maximum IF signal is generated. This is believed to correspond to minimizing the conversion loss, i.e., optimized mixing, for the particular mixer product used. Those settings are stored in a non-volatile memory accessible by the microprocessor and used to set the LO power and mixer bias when the unit is active, such as when it is mounted in the user's vehicle and turned on to detect police radar signals.

Additionally, radar warning receivers commonly look for signals in several police radar band signals as mentioned above such as by utilizing the fundamental (i.e., the first harmonic) of the local oscillator for X band radar signals, the second harmonic of the local oscillator frequency for K band signals, and the third harmonic of the local oscillator frequency for Ka band signals. Those non-fundamental harmonics may come from the local oscillator, but are more typically induced in a non-linear mixer from the fundamental frequency oscillator signal. Both are contemplated herein with reference to non-fundamental harmonics of the local oscillator signal. It is typically required that the DC bias and LO power be iteratively adjusted for each of those bands, and that the required DAC settings for the LO power and DC bias for each band be stored in non-volatile memory at the completion of the manufacturing test procedure, for use later during normal RF signal receiving operations of the receiver.

Setting up mixer optimization by iteratively adjusting the LO power and DC bias in the manufacturing process has several drawbacks. By way of example, the equipment used to test the equipment for setting the LO power and DC bias is expensive. Moreover, the time required to iteratively adjust those values is quite time consuming, especially if it must be repeated for each band of interest. Moreover, it is not uncommon for the components in the radar warning receiver to drift over time or temperature, which means that the LO power or DC bias may drift with time or temperature during use of the unit thereby degrading sensitivity. For radar warning receivers used by consumers, it is simply not practical to periodically pull the unit from the field for retesting and recalibration to maintain optimization. Moreover, such drift may occur rapidly and in a variety of contexts, such that factory recalibration is not particularly helpful.

SUMMARY OF THE INVENTION

The present invention provides an improved mixer optimization method which can be applied not only in the manufacturing process but is self-calibrating such that it can be employed in RF receivers, and especially radar warning receivers, which are in active use in the field. To this end, and in accordance with the principles of the present invention, for a given frequency or frequency band, a predetermined current correlated thereto is used to bias the mixer, and a DC voltage of the mixer is monitored while the power of the local oscillator is adjusted until the DC voltage of the mixer is at a predetermined level correlated to that frequency or band. That LO power setting is then stored in the memory of the system to drive the local oscillator for that frequency or frequency band during normal use. Periodically, the unit may again test for mixer optimization such that the LO power may be adjusted to take into account effects due to time and temperature. Typically, the unit will operate to optimize the mixer, and will then revert to normal operation, i.e., receiving and processing radar RF signals. In some cases, the DC current biasing the mixer may be retained at the predetermined level used for optimization for such "normal" operation, or the bias may be adjusted therefrom to a different level for "normal" operation.

In a swept oscillator system such as is used for a radar warning receiver, the optimization method may be employed between a predetermined number of sweeps or between every sweep depending upon the timing of the system, and the needs of the designers. Also, the process may be repeated for each band by providing first, second and third respective predetermined currents for biasing the mixer with respect to the X, K, and Ka bands, for example, and the power of the local oscillator adjusted with respect to each predetermined current one by one so as to determine the three settings for the local oscillator depending upon whether X, K or Ka bands are to be swept. In this regard, a typical radar warning receiver will not necessarily sweep all three bands at once, but will instead sweep band by band. Thus, the first power setting may be used for sweeping the X band, the second when sweeping the K band, and the third when sweeping the Ka band. In some cases, the power setting of the local oscillator can not be maintained level over the wide Ka band sweep. In that situation, the Ka band is broken into two narrower segments, with each segment having its own LO power setting for mixer optimization.

The local oscillator power setting for each band may thus be easily adjusted during the manufacturing process and/or while the unit is in use to maintain maximum mixer optimization. Advantageously, the optimization method is automatically undertaken during power-up of the receiver. In that case, the settings are determined anew every time the unit is powered up so that the settings need not be retained after the unit is turned off. Hence, the LO power settings may be stored in lower cost volatile memory. Also, there is no need for the expensive and time consuming test set ups otherwise used for optimizing the mixer. Thus, costs are reduced in the manufacturing process and operation of the receiver is maintained in an optimal state while in the field.

By virtue of the foregoing, there is thus provided a mixer optimization for active radar warning receivers, as well as other RF receiving units which utilize DC biased (and advantageously, DC current-biased) mixers and adjustable power local oscillators. These and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE DRAWINGS

Figure 1:
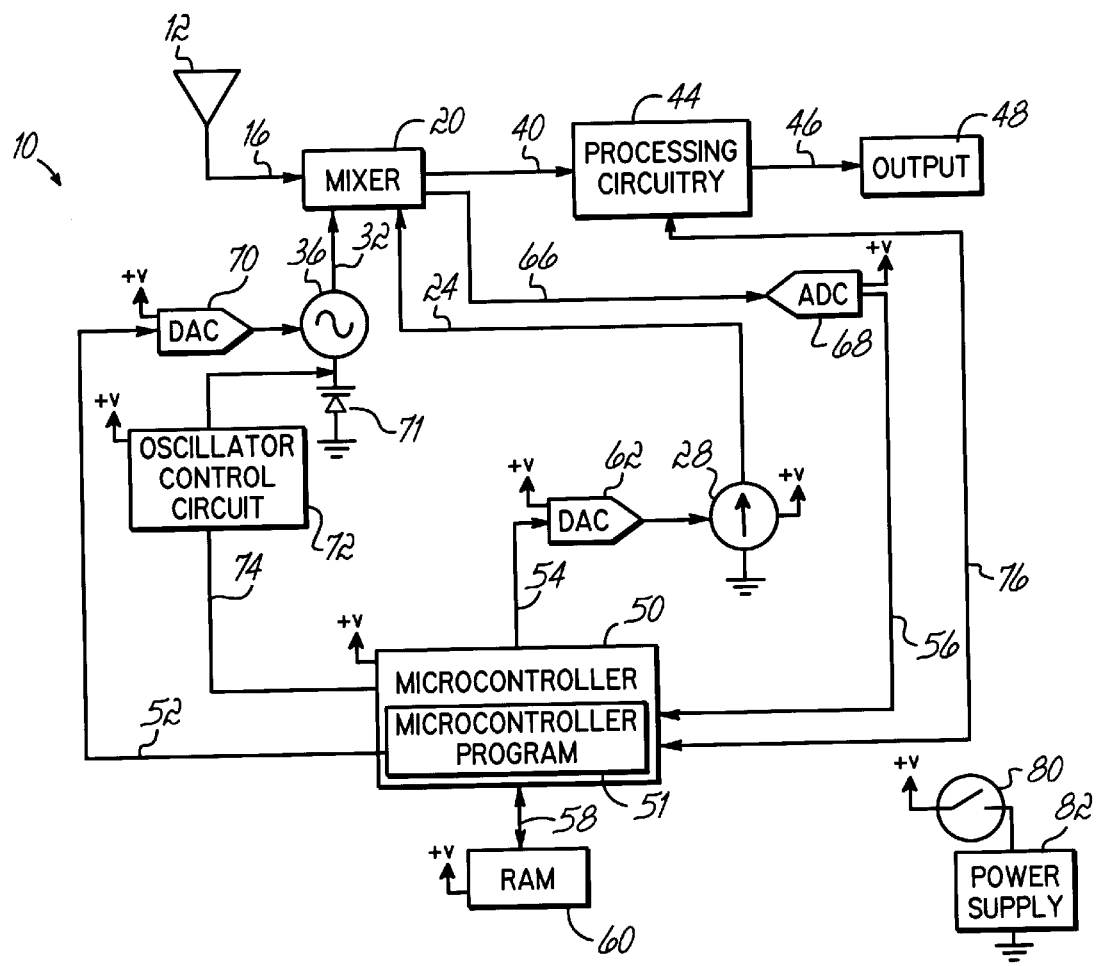
FIG. 1 is a simplified schematic of an RF receiver for purposes of explaining a mixer optimization method of the present invention.

With reference to FIG. 1, there is shown a simplified schematic illustration of an RF receiver 10 for purposes of explaining the mixer optimization method of the present invention. Receiver 10 includes an antenna 12 to receive RF signals. The RF signals are coupled from antenna 12, such as over line 16, to a mixer 20, the bias of which is varied by a DC signal, such as a DC current, on line 24 from adjustable DC emitter 28. Mixer 20 also receives local oscillator ("LO") signals over line 32 from variable power output local oscillator 36. Mixer 20 mixes the RF signals on line 16 with the LO signals on line 32 to produce IF output signals on line 40 as the output of receiver 10. Receiver 10 may optionally include processing circuitry 44 to process the IF signals to produce base band output signals as at 46. These output signals 46 may be used by one or more output devices 48 such as a speaker, buzzer, visual display, or other devices which produce human perceptible signals, or may produce outputs useable by other electronic devices. Processing circuitry may include further local oscillator and mixer sections, and demodulating, signal processing and other circuitry as will be readily recognized by those skilled in the art.

Receiver 10 includes a microprocessor or microcontroller 50 which communicates over common addressable or separate input/output (I/O) lines 52, 54, 56 and/or 58 with oscillator 36, DC emitter 28, mixer 20 and random access memory (RAM) 60. RAM 60 may be external of, or within, processor 50, and is advantageously volatile RAM. The I/O lines may be or include select, clock and data lines (not separately shown) as will be readily appreciated by those skilled in the art such that the digital data may be communicated in parallel and/or in serial format with microcontroller 50.

When the unit is first powered up and/or periodically while it is in active use, a mixer optimization method will be undertaken as will now be described to provide settings for the power output of local oscillator 36 to optimize mixer 20 at one or more selected RF frequencies or bands. To this end, the microcontroller program 51 of microprocessor 50 will cause digital data to be output on line 54 to digital-to-analog converter (DAC) 62 which will cause DC emitter 28 to output a predetermined level of DC bias, such as a predetermined DC current, on line 24 to bias mixer 20 in a predetermined manner. The predetermined level is in the microcontroller program in memory 51 of microprocessor 50 so as to be correlated to the RF frequency or frequency band of interest at antenna 12. With DC emitter 28 set to output the predetermined level, the DC voltage of mixer 20 is sensed on line 66 and converted by analog-to-digital converter (ADC) 68 to be coupled as digital data over lines 56 to microprocessor 50. The power output of oscillator 36 will be varied by digital data output on lines 52 to DAC 70 which sets the power of oscillator 36 depending upon the voltage sensed from mixer 20. The power output of oscillator 36 could be voltage dependent, such that the output of DAC 70 varies the voltage supply to the oscillator 36. Alternatively, the power output of the active circuitry, such as the transistors (not shown), of oscillator 36 could be varied by adjusting the current bias thereof. In that case, DAC 70 is used to adjust the bias current accordingly.

Local oscillator 36 may be designed to operate at a given frequency or band, or may be designed to operate at various frequencies and/or bands. Oscillator 36 may be voltage tuned such as by varactor diode 71 which responds to voltage signals from an oscillator control circuit 72. Control circuit 72 responds to digital data from microprocessor 50 on line 74 to set the frequency of oscillator 36 such as at a selected frequency or to sweep the oscillator 36 through a band of frequencies. Control circuit 74 may thus be a DAC or a sweep circuit, by way of example, or such other circuit as appropriate to control the frequency of oscillator 36 as will be readily appreciated by those skilled in the art. During mixer optimization or calibration, with oscillator 36 set to a selected frequency as indicated by signals on lines 74, microprocessor 50 evaluates the mixer voltage to determine whether it is greater than, less than, or equal to a desired or predetermined voltage defined within microcontroller program 51 to indicate optimized operation of mixer 20 at the frequency, or associated frequency band, of interest. If the DC voltage data signals on line 56 indicate that the voltage of mixer 20 is above the desired or predetermined voltage, the data signals on line 52 are varied to cause DAC 70 to increase the power output of oscillator 36. Conversely, if the digital data corresponding to the voltage from mixer 20 indicates that the DC voltage of mixer 20 is below the predetermined voltage, then the DAC 70 is instructed in a manner to reduce the power output of local oscillator 36. This process is continued until the voltage from mixer 20 is as close to the predetermined voltage as possible based on the resolution of the ADC and DAC devices 68 and 70, respectively. The digital data on line 52 which adjusts the LO power to achieve the predetermined voltage for mixer 20 is the LO power setting to be stored in volatile RAM 60 for use in setting the power output of the oscillator 36 whenever that same frequency or band of frequency is to be detected at antenna 12 during normal operation of receiver 10. The above process may be repeated for any frequency or frequency band of interest and the respective LO power setting stored in RAM 60 for each of the respective frequencies or bands.

Advantageously, the above-described optimization process occurs when receiver 10 is first turned on (such as by closing electronic or physical switch 80 which couples power from power supply 82 to the rest of the circuitry of receiver 10 as indicated by+V), and then periodically from time to time to overcome the effects of drift and/or temperature on the components of receiver 10. The optimization process may occur every so many seconds, minutes, or other fixed time periods, or may occur at variable rates as dictated by the needs and constraints of the designer. In any event, during normal operation to receive RF signals and output IF signals 40, microprocessor 50 will cause digital data to be output to set or sweep the frequency of oscillator 36 in correlation to the desired RF frequency or over the RF frequency band of interest. In conjunction therewith, digital data will be output to set the bias of mixer 20 for that RF frequency or band of interest (the bias may be, but need not be, the same as the bias used during the optimization method therefor), and the LO power setting associated with that RF frequency or band of interest will be output on line 52 as last determined by the optimization method for that frequency or band, so that the power output of oscillator 36 is set to cause mixer 20 to operate with minimum conversion loss as it outputs IF signals at 40 correlated to the RF frequency or band of interest.

Processing circuitry 44 may utilize IF signals at 40. To that end, processing circuitry 44 may communicate with microprocessor 50 as indicated by I/O lines 76, so as to determine when it is appropriate to process the signals as opposed to ignoring or otherwise handling same, such as might be the case during the performance of the optimization method. In this regard, processing circuitry 44 may form part of microprocessor 50 and/or may be separate, in whole or in part, therefrom as desired.

Figure 2:
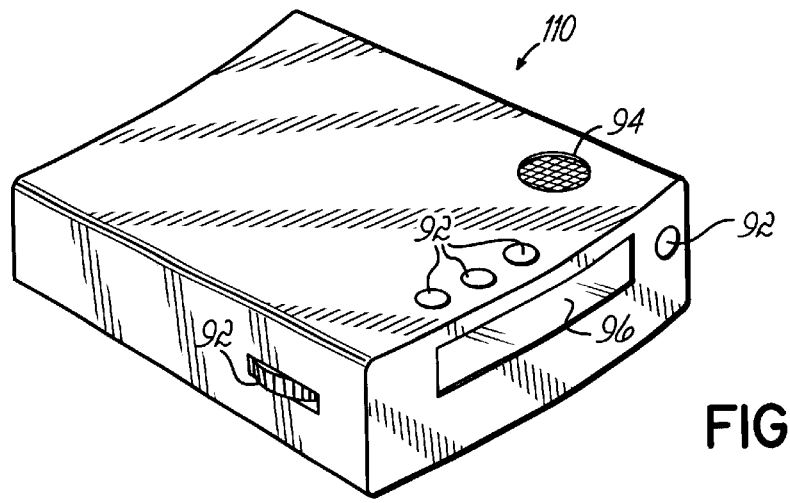
FIG. 2 is a perspective view of one embodiment of an exemplary radar warning receiver which may employ a mixer optimization method of the present invention.

With reference to FIG. 2, there is shown a perspective view of an exemplary radar warning receiver 110 which may be mounted to a windshield of a user's vehicle (both not shown) and powered up when a switch 180 (electronic or physical) is closed (FIG. 3) to couple the circuitry thereof to a power supply 182 (FIG. 3) which may include a regulator coupled to either an internal battery or through a cigarette lighter to a vehicle battery (both not shown) all as is otherwise generally conventional. Receiver 110 has various control buttons 92 (one of which may be part of switch 180), a buzzer or other audible output device 94, and a display 96. During active operation of the radar warning receiver 110, the unit will periodically scan or sweep through the radar band(s) of interest to detect signals in that band and then process them to determine whether they are actual or likely radar signals so as to give an alert to the user (not shown) such as by emitting a beeping or other sound at 94 correlated to the band in which the signal is received and/or providing a visual display thereof, such as at 96.

Figure 3:
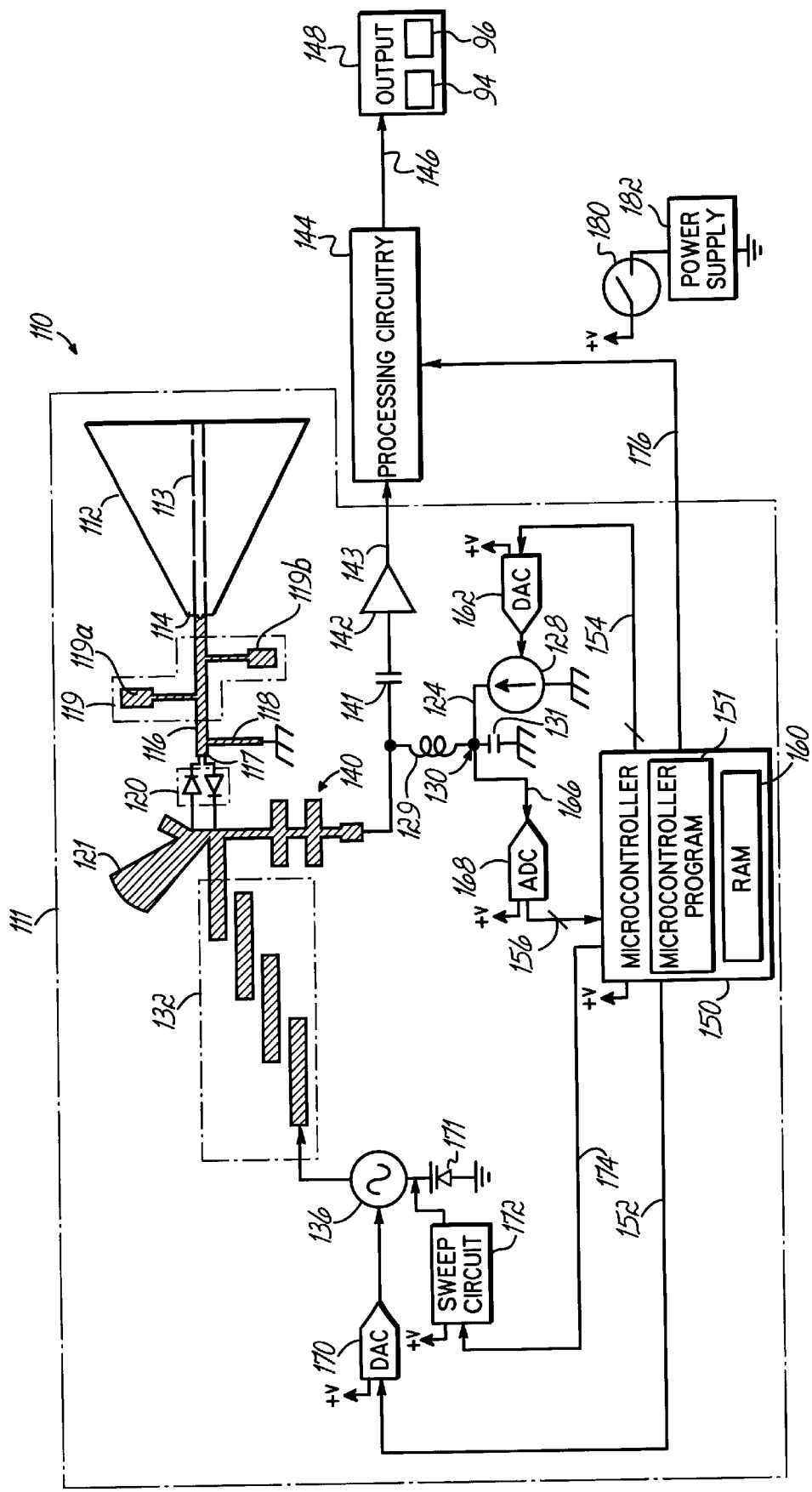
FIG. 3 is a top planar, partially schematic view of the circuitry, especially the RF front end, of the receiver of FIG. 2.

Inside the radar warning receiver 110 is receiver circuitry 111, one embodiment of which is shown in FIG. 3. Receiver circuitry 111 includes an antenna 112 such as a horn antenna which collects the RF signals incident thereon. Antenna 112 may include a ridge 113 as desired. The horn antenna terminates at a neck 114 coupled to a micro-strip line 116 which provides RF coupling between antenna 112 and anti-parallel mixer diode pair 120, as well as a DC connection therebetween. Extending from mixer end 117 of micro-strip line 116 is a DC return path 118. Also, strip line 116 includes an LO band stop micro-strip filter 119 comprised of spaced apart, and oppositely disposed, stubs 119a and 119b. DC return 118 may be eliminated and the ground return provided through ridge 113 and/or antenna 112 as the latter usually is also DC coupled to ground. Extending from the anti-parallel mixer diode pair 120 is an RF micro-strip back short 121.

A first local oscillator or LO 136 is adapted to output a local oscillator signal such as at a frequency $F_{LO}$, or swept through a band centered about $F_{LO}$. Digital data from microcontroller 150 over lines 174 cause sweep circuitry 172 to set the frequency of oscillator 136 at $F_{LO}$ and/or cause it to sweep through a band of frequencies which may, for example, be centered about $F_{LO}$, at a rate necessary to sweep a desired band. Oscillator 136 is coupled via a micro-strip LO band pass filter 132 to mixer 120. The output of mixer 120 is coupled through micro-strip IF filter 140 which outputs IF signals via capacitor 141 and IF amplifier 142 as at 143. The output 143 of receiver circuitry 111 is thus an IF signal which may be coupled to processing circuitry 144 (which may include a second and/or a third IF, and other circuitry such as a detector, a demodulator, and DSP circuitry or the like) to determine whether the RF signal at antenna 112 includes police radar signals such as in the X, K or Ka bands and to produce output signals at 146 which give the appropriate warning(s) to the user (not shown) via buzzer 94 and/or display 96 which may form part of output 148.

IF filter 140 also provides a DC path between mixer 120 and each of voltage controlled current source 128 and ADC 168. The power output of local oscillator 136 is adjustable in response to the output from DAC 170 which receives digital data corresponding to LO power settings on lines 152 from microcontroller 150. Also, driven by microcontroller 150 on digital lines 154 is DAC 162, the output of which sets the DC current output at 124 of voltage controlled current source 128 (which may be an op-amp and transistor, both not shown, with very high output impedance). The output of voltage controlled current source 128 is coupled through inductor 129 to IF filter 140, which creates a DC coupling of the current from source 128 through mixer diode pair 120 and to ground to thereby bias mixer 120. The electrical junction 130 of voltage controlled current source 128 and inductor 129 is bypassed to ground through capacitor 131, which thus provides at junction 130 a DC signal corresponding to the DC voltage level of mixer 120. That DC voltage is coupled over line 166 to be converted by ADC 168 to digital data corresponding to the DC voltage across mixer 120, with the digital data being transmitted over lines 156 to microcontroller 150.

In order to optimize mixer 120 for any given RF frequency or frequency band such as the X, K or Ka band(s) (or segments thereof), microcontroller 150 operates in an optimization mode under microcontroller program 151 to emit a signal on lines 174 to sweep circuit 172 to set the frequency of oscillator 136 for the band (or segment thereof) of interest, and on lines 154 to DAC 162 to cause voltage controlled current source 128 to output a predetermined mixer bias current correlated to the RF frequency or band of interest (or segment). While that mixer bias current is being output, the voltage of the mixer 120 is converted through ADC 168 and coupled over lines 156 to be evaluated by microcontroller 150. If the detected voltage is below a predetermined voltage at which minimum conversion loss or maximum optimization is believed appropriate to that band, the voltage powering local oscillator 136 is to be decreased. In that case, the digital data on line 152 to DAC 170 is decremented in value to decrease the output of DAC 170 to thus decrease the power from local oscillator 136. On the other hand, if the voltage from ADC 168 is higher than the predetermined voltage for that frequency or frequency band, then the data output over lines 152 is incremented to increase the voltage from DAC 170 to thereby increase the power from local oscillator 136. The above are repeated either by incrementing or decrementing the value of the digital data on lines 152 until the power output of oscillator 136 is adjusted such that the desired or predetermined voltage of mixer 120 for that frequency or band is detected by microcontroller 150 within the resolution of the ADC 168. Thereafter, the digital data on lines 152 at which oscillator 136 was so-adjusted is stored as the LO power setting by microcontroller 150 in, or associated with, RAM 160, which may advantageously be volatile RAM, to thereafter set the power output of oscillator 136 to detect signals at that frequency or in that frequency band during normal operation of receiver 110, until the optimization process is run anew for that band. While the embodiment herein reflects that the power of LO increases or decreases when the output of DAC 170 increases or decreases, respectively, one of ordinary skill in the art will recognize that the LO circuitry could be designed to increase or decrease as the output of DAC 170 decreases or increases, respectively.

Typically, for normal operation, signals on line 174 are used to cause sweep circuit 172 to sweep LO 136 between certain frequency ranges depending upon the radar band of interest. Where radar warning receiver 110 is to seek out radar signals in the X band, the first harmonic or fundamental frequency $F_{LO}$ of local oscillator 136 is to be used and the osillator is to be swept between 11.377 GHz and 11.477 GHz. Where radar signals in the K band are to be detected, the second harmonic of $F_{LO}$ will be used or induced by mixer 120 and, to that end, sweep circuit 172 causes LO 136 to sweep between 11.574 GHz and 11.674 GHz. For signal detection in the Ka band, it is advantageous to sweep the Ka band in two segments, that being the lower and upper segments, respectively. To sweep the lower segment of the Ka band, sweep circuit 172 is utilized to cause the local oscillator 136 to sweep between 11.074 GHz and 11.374 GHz. To sweep the upper segment of the Ka band, LO 136 is caused to sweep from 11.374 GHz to 11.674 GHz. For Ka band detection, the third harmonic of the frequency $F_{LO}$ of oscillator 136 will be operative in mixer 120. During each such sweep, whether it is for X, K, or the respective segments of the Ka band, the power setting of local oscillator 136 is to be set based on an optimization method correlated to that band or segment, so that power is advantageously set to minimize conversion loss. In the radar warning receiver 110 of FIG. 3, where the mixer 120 is anti-parallel mixer diode pair, the local oscillator signal is applied to the non linear anti-parallel diode pair thereby producing a time varying refection coefficient. The reflection coefficient waveform will have frequency components at the fundamental frequency of the local oscillator $F_{LO}$, and at harmonics thereof, $2F_{LO}$, $3F_{LO}$, etc. Through proper application of mixer bias and LO power, the amplitude of any selected reflection coefficient component may be maximized while other components are reduced in amplitude. That results in a maximum amplitude IF component generated from the selected reflection coefficient component, thus achieving optimized mixing at the frequency of the selected reflection coefficient.

The optimization method with respect to $F_{LO}$, $2F_{LO}$, or $3F_{LO}$ (X, K and Ka bands) is as follows. For the X band, the local oscillator signal is set by digital data on line 174 to either an end point of the sweep range (e.g., to 11.377 GHz or 11.477 GHz) or to the center point thereof (e.g., 11.427 GHz), and the predetermined current from source 128 is set to four milliamps (4.0 mA). Hence, the digital data to DAC 162 is set to advantageously cause voltage controlled current source 128 to output 4.0 mA. That setting is held while the digital data on line 154 reflecting the mixer voltage is monitored and the LO power (oscillator 136) is adjusted by changing the digital data on line 152 to DAC 170 until the mixer DC voltage equals 0.4 volts. The LO power setting may start from a minimum or some other point as desired. The digital data on line 152 which provides the desired 0.4 volts from mixer 120 is then stored in RAM 160 as an LO power setting for that band for later use during normal operation of receiver 110 to sweep for X band radar signals. During such normal operation in an X band sweep, the current source 128 is set to output the same 4.0 mA, with the LO power output at the level indicated by the LO power setting stored when the DC voltage for mixer 120 was last determined to be 0.4 volts during the X band optimization method.

The same optimization methodology is employed for the K band and each segment of the Ka band. To that end, to optimize mixing for the K band in the embodiment shown, LO 136 is set to one or the other end points or to the mid-range point of the K band sweep range, and mixer 120 would utilize the second harmonic thereof, i.e., $2F_{LO}$. The voltage controlled current source 128 is again set to output 4.0 mA, but the LO power is adjusted until the DC voltage from mixer 120 equals 0.3 volts. Thereafter, for actually conducting a sweep in the K band, the current bias is set to a different predetermined value which, in the case of K band for the unit shown in FIG. 3 is zero mA, by appropriate adjustment of the digital data on lines 154 to DAC 162. Similarly, to optimize mixing for signals at the third harmonic of the local oscillator, i.e., $3F_{LO}$, which is characteristic of the Ka band in the unit shown in FIG. 3, current source 128 is set to output a predetermined current of 7.0 mA by appropriate output from microcontroller 150 through DAC 162. Oscillator 136 is first set to one of the end points or the mid-range point of one of the Ka band segments, and the LO power is adjusted until the DC voltage of mixer 120 is equal to 0.24 volts. The LO 136 is then set to one of the end points or the mid-range point of the other Ka band segment, and the LO power again adjusted until the mixer voltage is 0.24 volts. For normal operation in each of the segments of the Ka band, the same 7.0 mA setting of source 128 is used.

In use, when the radar warning receiver 110 is powered up by turning on the receiver circuitry 111 thereof (such as by closing switch 180), microcontroller 150 will undergo a mixer optimization process for each band of police radar signals to be detected, i.e., the X, K and both segments of the Ka bands. For each band or segment, the LO 136 will be set to the appropriate frequency related to that band, the current source 128 will be set to bias mixer 120 with a respective predetermined current selected for that band, and the power output from local oscillator 136 will be varied until the DC voltage from mixer 120 is a predetermined voltage correlated to that band. The LO power setting at that time will be stored in RAM 160. When a sweep is to be undertaken of that band in normal operation, the power of local oscillator 136 is set based on the LO power setting stored in RAM 160 for that band from the optimization method, and the DC current may take on the respective predetermined current or may take on a second, different predetermined current such as zero mA. Also, the predetermined current for X and K bands during optimization may advantageously be the same, but the predetermined current for the third or Ka band being different in terms of the setting for mixer optimization, whereas the operating bias current at the three bands will be different. During normal operation, the oscillator 136 is also caused to sweep across the appropriate range of frequencies and at the appropriate rate for the band, or segment of the band, of interest.

The mixer optimization method may be periodically recommenced, such as every minute or so, or at other repeating or variable intervals such that mixer optimization is achieved without costly testing or equipment during the manufacturing process, and is also achieved in actual use of the receiver 110 in the field. Advantageously, in normal operation, the mixer is optimized for one band after one minute of operation, and then another band after another minute of operation, and then the third band after yet another minute, with the process repeating so that all bands are continuously optimized over time. Note that a complete cycle of optimizations for all of the bands takes only about 50 mS every four minutes if the Ka band segments are done separately.

Receiver 110 may go through a power-up sequence that optimizes mixer 120 and calibrates the frequency of local oscillator 136. The sequence may begin by outputting digital data on line 174 to set the oscillator tuning voltage from sweep circuit 172 to a default value which would normally be expected to cause oscillator 136 to output a signal at a selected frequency FLO. The mixer optimization method above-described is then undertaken for each of the X, K and Ka bands to obtain initial LO power settings for each band. In this case, for each band the output for DAC 170 is to start at the lowest power output for oscillator 136 and the power output increased until the predetermined mixer voltage is reached for that band. Thereafter, the oscillator frequency may be calibrated, using the initial LO power settings determined during the optimization, by appropriate modifications to the receiver circuitry and operation such as described in U.S. Pat. No. 6,069,580 the disclosure of which is incorporated herein by reference. Although, in that patent, the second LO is a phased lock loop synthesized oscillator, the second LO could be a voltage tuned oscillator, the output frequency of which could be divided by a digital frequency divider (not shown). The period of the divided signal can be measured by microcontroller 151 by using the crystal clock thereof (not shown) as a reference. This measurement capability allows the microcontroller to accurately set the frequency of the second LO through a DAC (not shown) connected to the tuning port of the second LO. Also, an electronic switch could be operated (such as by powering down amplifier 142 in FIG. 3) so that no RF signals interfere during frequency calibration.

With the oscillator frequency calibrated, LO 136 is then set to the more accurate frequency $F_{LO}$ for each band or segment, and the mixer optimization sequence re-run to get the actual LO power settings to use for normal operation thereafter until the mixer optimization process is run again. The frequency of oscillator 136 may also be recalibrated one last time using the new or actual LO power settings. Advantageously, every time the mixer is optimized for a band during normal use, the oscillator frequency is then recalibrated with that band's optimized LO power setting, although the two repetitions thereof as described above for power-up may not be necessary thereafter during normal use.

By virtue of the foregoing, there is thus provided a mixer optimization for active radar warning receivers, as well as other RF receiving units which utilize DC biased mixers and adjustable power local oscillators.

While the present invention has been illustrated by the description of embodiments thereof, and while the embodiments have been described in considerable detail, it is not intended to restrict or in any way iimit the scope of the appended claims to such detail. Additional advantages and modifications will readily appear to those skilled in the art. For example, it will be appreciated that the mixer optimization method may be applied to RF receivers which receive at a predetermined frequency or band of frequency, or which utilize a fixed frequency local oscillator or swept frequency oscillator, and may be applied to RF receivers which receive signals at multiple frequencies or multiple bands and again with fixed or swept frequency oscillators as appropriate. Further, while an anti-parallel mixer diode pair is shown in the embodiment of FIG. 3, other mixer constructions may be used that may be DC current biased or DC voltage biased. Similarly, the predetermined voltages of mixer 20 set forth herein are for GaAs diodes which have a conduction threshold of approximately 0.7 volts. Those skilled in the art will recognize that low and medium barrier diodes would have lower conduction thresholds and therefore different optimization voltages may be utilized. Also, the mixer DC voltage may be measured directly, rather than through the IF filter in FIG. 3, which provides a convenient DC tap for measuring the voltage in the embodiment shown in FIG. 3. Receiver circuitry 111 may be operated (+V) at nine volts or five volts depending, for example, on whether the receiver 110 is powered from a large power source such as a car battery, or from a small source, such as a small battery in hand-held units. Other operating voltages, and other predetermined currents or voltages, may be used as desired or needed. Still further, while the IF signals are shown coupled to processing circuitry, the IF signals may be the electronic end of the unit, so that others may apply any circuitry they desire for handling or processing of the IF signals. Also, in radar warning receiver 110, much of the processing circuitry 144 may form part of and/or communicate with microcontroller 150 (as indicated by lines 176) to save on space and cost of components as will be readily appreciated by those skilled in the art. Additionally, while the optimization method is typically undertaken for each band and then swept for normal reception before the next band is optimized, all three bands could be optimized, and then normal operation commenced. For the Ka band, while optimization is advantageously done, and sweeping for signals is conducted, in segments, if the power stability of the local oscillator is sufficient for such a wide band, the optimization and sweeping could be of the whole band rather than undertaken in segments. Hence, for purposes herein, a band may include a segment of a band. Alternatively, the mixer optimization could run while the unit is receiving RF signals for normal operation, especially where the mixer bias for normal and optimization operation are the same. The invention in its broader aspects is therefore not limited to the specific details, representative apparatus and methods and illustrative examples shown and described. Accordingly, departures may be made from such details without departing from the scope or spirit of applicant's general inventive concept.

Having described the invention, what is claimed is:

1. A mixer optimization method for a radar warning receiver having an antenna adapted to receive police radar signals in the X, K and Ka bands, a variable power local oscillator adapted to output a local oscillator signal, and a current-biased mixer coupled to output IF signals at an IF frequency correlated to respective harmonics of the local oscillator signal associated with the respective police radar signal bands, the mixer optimization method comprising:

operating the local oscillator to output a local oscillator signal at a frequency associated with a sweep of the X band, biasing the mixer with a first predetermined current correlated to the X band, monitoring a DC voltage of the mixer, adjusting the power of the local oscillator until the DC voltage of the mixer is at a first predetermined voltage, and thereafter, with the power of the local oscillator set to the power as so-adjusted, operating the receiver to output IF signals at a frequency correlated to a first respective harmonic of the local oscillator signal associated with the X band;

operating the local oscillator to output a local oscillator signal at a frequency associated with a sweep of the K band, biasing the mixer with a second predetermined current correlated to the K band, monitoring a DC voltage of the mixer, adjusting the power of the local oscillator until the DC voltage of the mixer is at a second predetermined voltage, and thereafter, with the power of the local oscillator set to the power as so-adjusted, operating the receiver to output IF signals at a frequency correlated to a second respective harmonic of the local oscillator signal associated with the K band; and operating the local oscillator to output a local oscillator signal at a frequency associated with a sweep of the Ka band, biasing the mixer with a third predetermined current correlated to the Ka band, monitoring a DC voltage of the mixer, adjusting the power of the local oscillator until the DC voltage of the mixer is at a third predetermined voltage, and thereafter, with the power of the local oscillator set to the power as so-adjusted, operating the receiver to output IF signals at a frequency correlated to a third respective harmonic of the local oscillator signal associated with the Ka band.

2. The mixer optimization method of claim 1 further comprising, with the power of the local oscillator set to the power as so-adjusted and while operating the receiver to output IF signals at a frequency correlated to a second respective harmonic of the local oscillator signal associated with the K band, biasing the mixer to a fourth predetermined current different from the second predetermined current.

3. The mixer optimization method of claim 2, the fourth predetermined current being zero milliamps.

4. The mixer optimization method of claim 1, the first and second predetermined currents being substantially the same.

5. The mixer optimization method of claim 4, the third predetermined current being greater than the first and second predetermined currents.

6. The mixer optimization method of claim 1, the third predetermined current being greater than the first and second predetermined currents.

7. The mixer optimization method of claim 1, the first predetermined voltage being greater than the second and third predetermined voltages.

8. The mixer optimization method of claim 7, the second predetermined voltage being greater than the third predetermined voltage.

9. The method of claim 1 wherein adjusting the power of the local oscillator includes increasing the power of the local oscillator if the DC voltage of the mixer is above the respective predetermined voltage.

10. The method of claim 1 wherein adjusting the power of the local oscillator includes decreasing the power of the local oscillator if the DC voltage of the mixer is below the respective predetermined voltage.

11. The mixer optimization method of claim 1 further comprising providing a diode mixer.

12. The mixer optimization method of claim 1 further comprising providing an antiparallel diode pair mixer.

13. The mixer optimization method of claim 1 further comprising providing a local oscillator having a local oscillator signal such that the fundamental frequency thereof is the first selected harmonic, the second harmonic thereof is the second selected harmonic, and the third harmonic thereof is the third selected harmonic.

14. The mixer optimization method of claim 1, the first and second predetermined currents being approximately 4.0 milliamps, the third predetermined current being approximately 7.0 milliamps, the first predetermined voltage being approximately 0.4 volts, the second predetermined voltage being approximately 0.3 volts, and the third predetermined voltage being approximately 0.24 volts.

15. The mixer optimization method of claim 14 further comprising, with the power of the local oscillator set to the power as so-adjusted and while operating the receiver to output IF signals at a frequency correlated to a second respective harmonic of the local oscillator signal associated with the K band, biasing the mixer to a fourth predetermined current different from the second predetermined current.

16. The mixer optimization method of claim 15, the fourth predetermined current being zero milliamps.

17. The mixer optimization method of claim 1 further comprising storing the adjustment settings in memory for use in setting the power of the local oscillator to optimize the mixer with the receiver operating to output IF signals.

18. The mixer optimization method of claim 17 further comprising storing the adjustment settings in volatile RAM.

19. The mixer optimization method of claim 1, wherein the receiver is operated to output IF signals correlated to each of the respective harmonics of the local oscillator a plurality of times before any subsequent adjustment of the power of the local oscillator for any such respective harmonic.

20. A mixer optimization method for a microwave receiver having an antenna adapted to receive microwave signals at an RF frequency, a variable power local oscillator adapted to output a local oscillator signal, and a current-biased mixer coupled to output IF signals at a frequency correlated to the RF frequency and the local oscillator signal, the mixer optimization method comprising:

biasing the mixer with a first predetermined current, monitoring a DC voltage of the mixer, and adjusting the power of the local oscillator until the DC voltage of the mixer is at a predetermined voltage.

21. The mixer optimization method of claim 20 further comprising, with the power of the local oscillator set to the power as so-adjusted, operating the receiver to output IF signals at a frequency correlated to the RF frequency and the local oscillator signal.

22. The mixer optimization method of claim 20 further comprising, with the power of the local oscillator set to the power as so-adjusted, biasing the mixer with a second, different predetermined current while operating the receiver to output IF signals at a frequency correlated to the RF frequency and the local oscillator signal.

23. The mixer optimization method of claim 22, the second, different predetermined current being zero milliamps.

24. The mixer optimization method of claim 20 wherein adjusting the power of the local oscillator includes increasing the power of the local oscillator if the DC voltage of the mixer is above the predetermined voltage.

25. The mixer optimization method of claim 20 wherein adjusting the power of the local oscillator includes decreasing the power of the local oscillator if the DC voltage of the mixer is below the predetermined voltage.

26. The mixer optimization method of claim 20 further comprising storing the adjustment settings in memory for use in setting the power of the local oscillator to optimize the mixer with the receiver operating to output IF signals.

27. The mixer optimization method of claim 26 further comprising storing the adjustment settings in volatile RAM.

28. A mixer optimization method for a radar warning receiver having an antenna adapted to receive police radar signals in the X, K and Ka bands, a variable power local oscillator adapted to output a local oscillator signal, and a current-biased mixer coupled to output IF signals at an IF frequency correlated to respective harmonics of the local oscillator signal associated with the respective police radar signal bands, the mixer optimization method comprising:

operating the local oscillator to output a local oscillator signal at a frequency associated with a sweep of the X band, biasing the mixer with a first predetermined current correlated to the X band, monitoring a DC voltage of the mixer, adjusting the power of the local oscillator until the DC voltage of the mixer is at a first predetermined voltage, and thereafter, with the power of the local oscillator set to the power as so-adjusted, operating the receiver to output IF signals at a frequency correlated to a first respective harmonic of the local oscillator signal associated with the X band;

operating the local oscillator to output a local oscillator signal at a frequency associated with a sweep of the K band, biasing the mixer with a second predetermined current correlated to the K band, monitoring the DC voltage of the mixer, adjusting the power of the local oscillator until the DC voltage of the mixer is at a second predetermined voltage, and thereafter, with the power of the local oscillator set to the power as so-adjusted, operating the receiver to output IF signals at a frequency correlated to a second respective harmonic of the local oscillator signal associated with the K band;

operating the local oscillator to output a local oscillator signal associated with a sweep of a first segment of the Ka band, biasing the mixer with a third predetermined current correlated to the Ka band, monitoring the DC voltage of the mixer, adjusting the power of the local oscillator until the DC voltage of the mixer is at a third predetermined voltage, and thereafter, with the power of the local oscillator set to the power as so-adjusted, operating the receiver to output IF signals at a frequency correlated to a third respective harmonic of the local oscillator signal associated with the first segment of the Ka band; and operating the local oscillator to output a local oscillator signal associated with a sweep of a second segment of the Ka band, biasing the mixer with the third predetermined current, monitoring the DC voltage of the mixer, adjusting the power of the local oscillator until the DC voltage of the mixer is at the third predetermined voltage, and thereafter, with the power of the local oscillator set to the power as so-adjusted, operating the receiver to output IF signals at a frequency correlated to a third respective harmonic of the local oscillator signal associated with the second segment of the Ka band.

29. A mixer optimization method for a microwave receiver having an antenna adapted to receive microwave signals at multiple RF frequencies, a variable power local oscillator adapted to output a local oscillator signal, and a current biased mixer coupled to output IF signals at a frequency correlated a respective harmonic of the local oscillator frequency associated with a respective RF frequency, the mixer optimization method comprising:

operating the local oscillator to output a local oscillator signal associated with a first respective RF frequency, biasing the mixer with a first predetermined current correlated to the first respective RF frequency, monitoring a DC voltage of the mixer, adjusting the power of the local oscillator until the DC voltage of the mixer is at a first predetermined voltage, and thereafter, with the power of the local oscillator set to the power as so-adjusted, operating the receiver to output IF signals at a frequency correlated to a first respective harmonic of the local oscillator signal associated with said first respective RF frequency; and operating the local oscillator to output a local oscillator signal associated with a second, different respective RF frequency, biasing the mixer with a second predetermined current correlated to the second respective RF frequency, monitoring a DC voltage of the mixer, adjusting the power of the local oscillator until the DC voltage of the mixer is at a second predetermined voltage, and thereafter, with the power of the local oscillator set to the power as so-adjusted, operating the receiver to output IF signals at a frequency correlated to a second respective harmonic of the local oscillator signal associated with said second respective RF frequency.

30. The mixer optimization method of claim 29, the first and second predetermined currents being substantially the same.

31. The mixer optimization method of claim 29, the first and second predetermined voltages being different.

32. The mixer optimization method of claim 29 further comprising, with the power of the local oscillator set to the power as so-adjusted with respect to at least one of said respective RF frequencies, biasing the mixer with a second, different predetermined current while operating the receiver to output IF signals at a frequency correlated to the respective harmonic of the local oscillator signal associated with the at least one RF frequency.

33. The method of claim 32, the second, different predetermined current being zero milliamps.

34. The mixer optimization method of claim 29, the first selected harmonic being a fundamental frequency of the local oscillator signal.

35. The mixer optimization method of claim 29, the second selected harmonic being one of a second and a third harmonic frequency of the local oscillator signal.

36. The mixer optimization method of claim 29 wherein adjusting the power of the local oscillator includes increasing the power of the local oscillator if the DC voltage of the mixer is above the respective predetermined voltage.

37. The mixer optimization method of claim 29 wherein adjusting the power of the local oscillator includes decreasing the power of the local oscillator if the DC voltage of the mixer is below the respective predetermined voltage.

38. The mixer optimization method of claim 29 further comprising storing the adjustment settings in memory for use in setting the power of the local oscillator to optimize the mixer with the receiver operating to output IF signals.

39. The mixer optimization method of claim 38 further comprising storing the adjustment settings in volatile RAM.

40. A mixer optimization method for a microwave receiver having an antenna adapted to receive microwave signals at an RF frequency, a variable power local oscillator adapted to output a local oscillator signal, and a DC-biased mixer coupled to output IF signals at a frequency correlated to the RF frequency and the local oscillator signal, the mixer optimization method comprising:

biasing the mixer with a first predetermined DC bias signal, monitoring a DC level signal of the mixer, and adjusting the power of the local oscillator until the DC level signal of the mixer is at a predetermined value.

* * * * *

UNITED STATES PATENT AND TRADEMARK OFFICE
CERTIFICATE OF CORRECTION

PATENT NO.    : 6,693,578 B1
DATED         : February 17, 2004
INVENTOR(S)   : Glen D. Martinson It is certified that error appears in the above-identified patent and that said Letters Patent is hereby corrected as shown below:

<u>Title page,</u>
Item [57], ABSTRACT,
Line 9, "frequencies or band or interest" should read -- frequencies or band of interest --

<u>Column 7,</u>
Line 48, "to sweep bet ween 11.074 GHz" should read -- to sweep between 11.074 GHz --
Line 61, "varying refection coefficient" should read -- varying reflection coefficient --

<u>Column 9,</u>
Line 36, "selected frequency FLO" should read -- selected frequency $F_{LO}$ --

<u>Column 10,</u>
Line 13, "any way iimit the scope" should read -- any way limit the scope --

<u>Column 14,</u>
Line 12, "correlated a respective harmonic" should read -- correlated to a respective harmonic --

Signed and Sealed this

Fifteenth Day of June, 2004

JON W. DUDAS
*Acting Director of the United States Patent and Trademark Office*